United States Patent
Yanagisawa et al.

(10) Patent No.: US 6,875,701 B2
(45) Date of Patent: Apr. 5, 2005

(54) NANOTOPOGRAPHY REMOVING METHOD

(75) Inventors: Michihiko Yanagisawa, Sagamihara (JP); Tadayoshi Okuya, Yokohama (JP)

(73) Assignee: Speedfam Co., Ltd., Kanagawa-Pref. (JP)

( * ) Notice: Subject to any disclaimer, the term of this patent is extended or adjusted under 35 U.S.C. 154(b) by 396 days.

(21) Appl. No.: 10/062,494

(22) Filed: Feb. 5, 2002

(65) Prior Publication Data

US 2002/0104825 A1 Aug. 8, 2002

(30) Foreign Application Priority Data

Feb. 5, 2001 (JP) .................................. 2001-027639

(51) Int. Cl.⁷ .................................................... H01L 21/302
(52) U.S. Cl. ......................... 438/714; 438/9; 438/16; 438/710; 216/60; 216/67
(58) Field of Search .................... 216/60, 67; 438/710, 438/714, 9, 16; 345/345.24, 345.33, 345.54

(56) References Cited

U.S. PATENT DOCUMENTS

| | | | | |
|---|---|---|---|---|
| 4,734,158 A | | 3/1988 | Gillis | |
| 5,254,830 A | * | 10/1993 | Zarowin et al. | 219/121.43 |
| 5,459,326 A | * | 10/1995 | Yamada | 250/398 |
| 6,147,004 A | | 11/2000 | Gardner et al. | |
| 6,280,645 B1 | * | 8/2001 | Yanagisawa et al. | 216/38 |
| 6,649,528 B2 | * | 11/2003 | Yanagisawa et al. | 438/706 |
| 2001/0007275 A1 | * | 7/2001 | Yanagisawa et al. | 156/345 |
| 2003/0199168 A1 | * | 10/2003 | Yanagisawa et al. | 438/692 |

FOREIGN PATENT DOCUMENTS

| | | |
|---|---|---|
| EP | 0 516 480 A2 | 2/1992 |
| EP | 0 514 046 A1 | 11/1992 |
| EP | 0 975 016 A1 | 1/2000 |
| JP | 9-27482 | 1/1997 |

* cited by examiner

Primary Examiner—George A. Goudreau
(74) Attorney, Agent, or Firm—Morrison & Foerster LLP

(57) ABSTRACT

To remove nanotopography (unevenness of wavelength: 0.2 mm through 20 mm, wave height: 1 through several hundreds nm) which has already been produced on a surface of a semiconductor wafer which has been regarded as impossible to remove conventionally, a half value width of an etching profile of activated species gas is set to fall in a range equal to or smaller than a wavelength a of nanotopography and equal to or larger than a half thereof. Based on previously measured data of nanotopography, moving speed and locus of injected activated species gas along a surface of a semiconductor wafer are calculated and controlled.

4 Claims, 3 Drawing Sheets

ORIGIN

NANOTOPOGRAPHY REMOVING METHOD

BACKGROUND OF THE INVENTION

1. Field of the Invention

The present invention relates to a technology of removing nanotopography produced on a surface of a semiconductor wafer in a process of semiconductor fabrication.

2. Description of the Related Art

Nanotopography refers to nanometer scale height variation or unevenness, produced on a surface of a semiconductor wafer, a spatial wavelength thereof falls in a range of about 0.2 mm through 20 mm and a difference of height between wave top and wave bottom (hereinafter, referred to as wave height) falls in a range of 1 through several hundreds nm.

There has been adopted multilayer wiring technology in a semiconductor device and to meet request of the wiring technology, there has been developed a chemical and mechanical composite polishing process referred to as CMP (Chemo-Mechanical Polishing). Although the surface of a semiconductor wafer can always be planarized highly accurately by the CMP technology, there poses a problem by very fine unevenness having different levels, so-to-speak nanotopography which cannot be removed even by the CMP apparatus. This is a problem which attracts attention since yield of a semiconductor device is deteriorated because there is caused film thickness nonuniformity in an insulating layer film on the surface of a semiconductor wafer.

Nanotopography is said to be cause by all the steps of semiconductor silicon wafer fabrication, for example, doping nonuniformity in a step of pulling silicon crystal, lapping mark, polishing mark, slicing mark, etching mark or the like and among them, particularly, etching mark (removal of damage of bottom face) is said to constitute maximum cause.

In order to restrain nanotopography based on various causes in this way from producing, a wafer maker carries out various devises such as fine caution on respective processes, shift to a process which is difficult to produce nanotopography (for example, from acidic etching to alkaline etching), or use of a both face mirror wafer and so on. Further, it is the actual situation that a semiconductor wafer producing nanotopography even thereby, is dealt with by using the semiconductor wafer as a semiconductor device at a level at which the produced nanotopography is not problematic, or disposed as a failed product.

Presence of nanotopography is found after a semiconductor silicon wafer has been processed by a number of steps in steps of semiconductor silicon wafer fabrication and therefore, when the presence is found, not only the number of steps and expense which have been paid until the presence is found, are wasted but also an increase in yield of products to a constant level or higher and accordingly, a reduction in fabrication cost, are made difficult. Therefore, it is mostly desired to develop a technology of preventing nanotopography from producing basically, besides the development, it is necessary to pay a consideration to how to effectively remove nanotopography which has already been produced.

Plasma etching apparatus is known as an apparatus for planarizing a silicon wafer having very small unevenness on its surface. According to the apparatus, sulfur hexafluoride ($SF_6$) gas or the like is formed into plasma at inside of a plasma generating apparatus and F activated species formed by the plasma formation is injected from a nozzle and is blown to the surface of a silicon wafer. The nozzle is scanned at speed in accordance with unevenness of the surface of the silicon wafer and by controlling scanning speed, much of material at projected portions is removed to thereby carry out planarizing.

In this case, the step referred to as planarizing actually signifies uniform formation of a thickness of a silicon wafer and very small unevenness referred to as planarized, is provided with a period equal to or larger than 10 mm and a height (wave height) of 100 through several hundreds nm (nanometer). Therefore, a degree of the planarizing differs from unevenness of the above-described nanotopography (wavelength: 0.2 mm through 20 mm, wave height: 1 through several hundreds nm) in view of the level and accordingly, nanotopography cannot be machined by using an existing plasma etching apparatus for planarizing machining.

As described above, it is a problem of the invention to provide a technology for removing nanotopography which has already been produced on a surface of a semiconductor wafer.

SUMMARY OF THE INVENTION

The above-described problem can be resolved by means shown below. That is, according to resolving means of a first aspect of the invention, there is provided a method of removing nanotopography for removing nanotopography on a surface of a semiconductor wafer by injecting an activated species gas to a surface of a semiconductor wafer wherein a moving speed and a locus of the injected activated species gas along the surface of the semiconductor wafer are calculated and controlled based on previously measured data of the nanotopography.

According to resolving means of a second aspect of the invention, there is provided a method of removing nanotopography according to the first aspect wherein a half value width of an etching profile of the activated species gas falls in a range equal to or smaller than a wavelength of the nanotopography and equal to or larger than a half thereof.

According to resolving means of a third aspect of the invention, there is provided the method of removing nanotopography according to the first or second aspect wherein the activated species gas is an activated species gas produced by plasma of a mixture gas including sulfur hexafluoride gas.

According to resolving means of a fourth aspect of the invention, there is provided an apparatus of removing nanotopography for removing nanotopography on a surface of a semiconductor wafer by injecting an activated species gas to the surface of the semiconductor wafer, the apparatus for removing nanotopography comprising a plasma apparatus for producing the activated species gas, a nozzle for injecting the produced activated species gas, and a drive apparatus for moving the semiconductor wafer along the surface, wherein the nozzle is provided with an etching profile in which a half value width of the etching profile of the activated species gas falls in a range equal to or smaller than a wavelength of the nanotopography and equal to or larger than a half thereof.

Other objects and advantages besides those discussed above shall be apparent to those skilled in the art from the description of a preferred embodiment of the invention which follows. In the description, reference is made to accompanying drawings, which form a part thereof, and which illustrate an example of the invention. Such example, however, is not exhaustive of various embodiments of the invention, and therefore reference is made to the claims which follow the description for determining the scope of the invention.

BRIEF DESCRIPTION OF THE DRAWINGS

The accompanying drawings, which are incorporated in and constitute a part of the specification, illustrate embodiments of the invention and together with the description, serve to explain the principles of the invention.

FIGS. 3(a) and 3(b) are diagrams representing unevenness of a surface of a silicon wafer in which FIG. 3(a) shows a surface of a silicon wafer before subjected to planarizing and FIG. 3(b) shows a surface thereof after subjected to planarizing.

DETAILED DESCRIPTION OF THE PREFERRED EMBODIMENTS

Now, preferred embodiments of the present invention will be described in detail while referring to the accompanying drawings.

Figure 1:
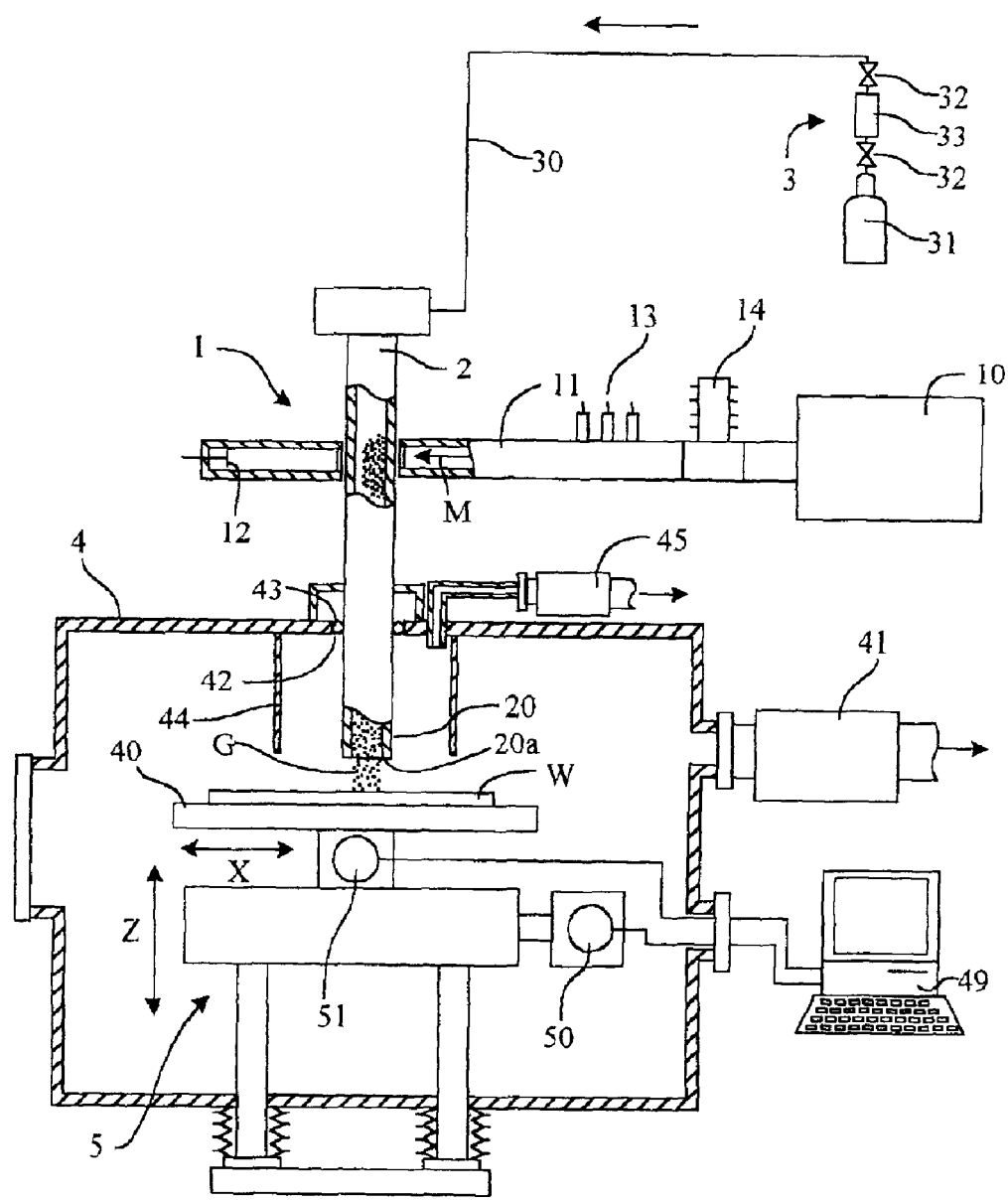
FIG. 1 is an outline constitution view showing a nanotopography removing apparatus for removing nanotopography on a surface of a silicon wafer.

FIG. 1 is an outline constitution view showing a nanotopography removing apparatus for removing nanotopography of a surface of a silicon wafer.

The nanotopography removing apparatus is provided with a plasma generator 1, a gas supply apparatus 3 and an X-Y drive mechanism 5. The plasma generator 1 is an apparatus for producing activated species gas G including neutral radicals by subjecting a gas of an alumina discharge tube to plasma formation and is constituted by a microwave oscillator 10 and a waveguide 11. The microwave oscillator 10 is a magnetron and can oscillate microwave M at predetermined frequency.

The waveguide 11 is for propagating the microwave M oscillated by the microwave oscillator 10 and an alumina discharge tube 2 is inserted laterally into the waveguide 11.

A reflecting plate (short plunger) 12 for forming a standing wave by reflecting the microwave M, is attached to an inner portion of a left side end of the waveguide 11. Further, at middle of the waveguide 11, there are attached a stub tuner 13 for carrying out phase matching of the microwave M and an isolator 14 for bending the reflected microwave M directed to the microwave oscillator 10 in a direction of 90 degrees (direction of surface of FIG. 1).

The alumina discharge tube 2 is a cylindrical member having a nozzle portion 20 at its lower end portion and is connected with a supply pipe 30 of the gas supply apparatus 3 at its upper end portion.

The gas supply apparatus 3 is an apparatus for supplying gas to inside of the alumina discharge tube 2, is provided with a cylinder 31 of $SF_6$ (sulfur hexafluoride) gas and the cylinder 31 is connected to the supply pipe 30 via valves 32 and a flow rate controller 33. Further, although the sulfur hexafluoride gas can constitute single gas in this way, mixture gas including sulfur hexafluoride gas can also be constituted by simultaneously supplying other gas to the supply pipe 30.

By constructing the plasma generator 1 by such a constitution, gas is supplied from the supply apparatus 3 to the alumina discharge tube 2 and when the microwave M is oscillated from the microwave oscillator 10, plasma formation of gas is carried out at inside of the alumina discharge tube 2 and the activated species gas G produced by the plasma formation is injected from the nozzle portion 20.

When a silicon wafer W is arranged on a wafer table 40 at inside of a chamber 4, the silicon wafer W is adsorbed by electrostatic force of the wafer table 40. The chamber 4 is attached with a vacuum pump 41 and inside of the chamber 4 can be vacuumed by the vacuum pump 41. Further, a hole 42 is perforated at a central portion of a top face of the chamber 4 and the nozzle portion 20 of the alumina discharge 2 is externally inserted into the chamber 4 via the hole 42. Further, an O-ring 43 is mounted between the hole 42 and the alumina discharge tube 2 to thereby maintain an interval between the hole 42 and the alumina discharge tube 2 in airtight. Further, a duct 44 is provided at a surrounding of the nozzle portion 20 inserted into the hole 42 and by driving a vacuum pump 45, gases produced by reaction in etching can be exhausted to outside of the chamber 4.

The X-Y drive mechanism 5 is arranged at inside of the chamber 4 and supports the wafer table 40 from its lower side. The X-Y drive mechanism 5 moves the wafer table 40 in a left and right direction of FIG. 1 by an X drive motor 50 thereof and by a Y drive motor 51 thereof, the wafer table 40 and the X drive motor 50 are integrally moved in a direction of top and bottom of a paper face of FIG. 1. That is, by the X-Y drive mechanism 5, the nozzle portion 20 can be moved in X-Y directions relative to the silicon wafer W.

When the valves 32 of the gas supply apparatus 3 are opened, $SF_6$ gas in the cylinder 31 flows out to the supply pipe 30 and is supplied to the alumina discharge tube 2. At this occasion, a flow rate of $SF_6$ gas is adjusted by an opening degree of the valve 32.

In parallel with operation of supplying the $SF_6$ gas or a mixture gas thereof, the microwave oscillator 10 is driven. Then, $SF_6$ gas is subjected to plasma formation by the microwave M and there is produced the activated species gas G including F (fluorine) radicals (neutral activated species) constituting neutral radicals. Thereby, the activated species gas G is guided to the nozzle portion 20 of the alumina discharge tube 2 and is injected from an opening 20a of the nozzle portion 20 toward a side of the silicon wafer W.

In parallel with injection of the activated species gas, the X-Y drive mechanism 5 is driven by a control computer 49 and the wafer table 40 adsorbed with the silicon wafer W is moved in X-Y directions. At this occasion, with regard to a locus traced by the nozzle portion 20 at a top face of the silicon wafer W, various loci can be selected in accordance with away of distributing nanotopography. A description will be given later of the loci.

A material on a surface of the silicon wafer chemically reacts with the activated species gas, produced gaseous substances flow out from the site along with the injected gas and therefore, a material is removed from the surface of the silicon wafer W thereby. A removed amount of the material is substantially proportional to a time period of being exposed to the activated species gas and therefore, the moving amount is controlled by controlling relative speed between the silicon wafer W and the nozzle portion 20.

Figure 2:
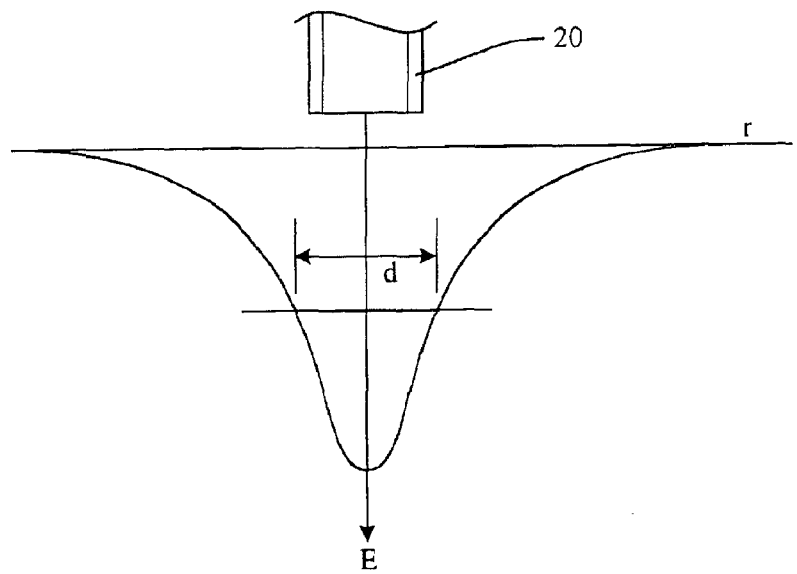
FIG. 2 is a graph showing a distribution of an amount (depth) of a silicon wafer material per unit time removed by an injected activated species gas.

FIG. 2 is a graph showing a distribution of an amount (depth) of a silicon wafer material per unit time removed by the injected activated species gas, which is very similar to a Gaussian distribution and is referred to as an etching profile. As shown by FIG. 2, an etching rate E is provided with a maximum value Emax on a center line of the nozzle portion 20 and the etching rate E is reduced as the location becomes remote from the center in a radius r direction. Normally, the characteristic of the nozzle is represented by using a width indicating the etching rate E having a value of a half of Emax, that is, a half value width d. There is used a planarizing apparatus which is referred to as a local etching apparatus, having the half value width d of around 25 mm.

Figure 3:
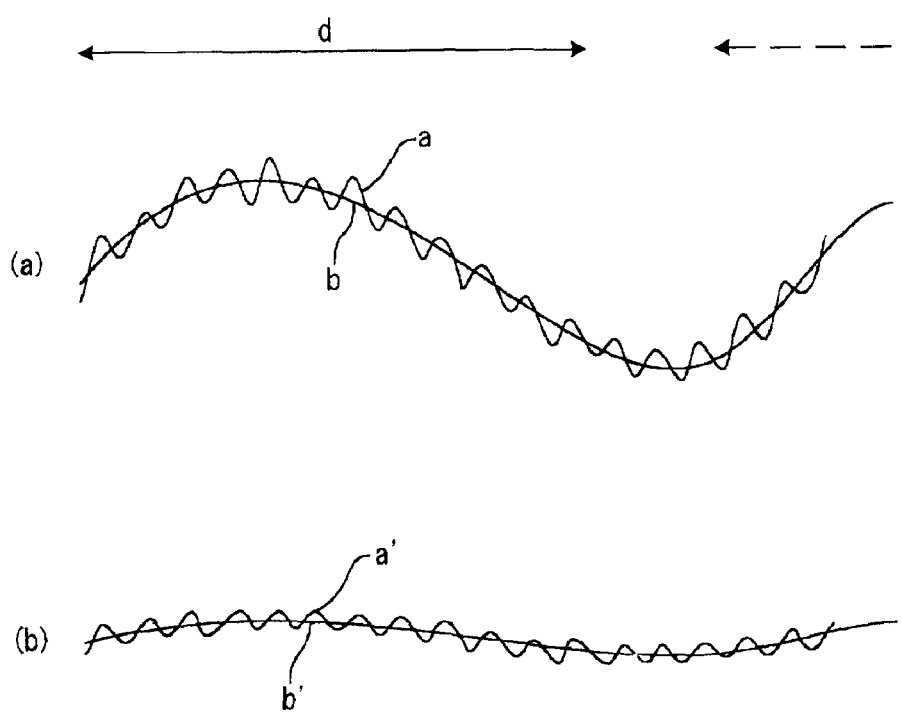

FIGS. 3(a) and 3(b) are diagrams representing unevenness of a surface of a silicon wafer in which FIG. 3(a) shows a surface of a silicon wafer before subjected to planarizing and FIG. 3(b) shows a surface thereof after subjected to planarizing. As shown by FIG. 3(a), the surface of the silicon wafer is formed by unevenness comprising comparatively short wavelength components a and comparatively long wavelength components b. When the planarizing is carried out by the planarizing apparatus by the conventional way, macroscopically, it seems that planarizing is carried out by removing the long wavelength components b, however, microscopically, as shown by FIG. 3(b), unevenness of the short wavelength components a' remain substantially as they are (although wave heights are lowered).

The reason is that according to the conventional planarizing apparatus, planarizing is carried out an etching profile having a large half value width d and accordingly, the unevenness having long wavelengths can selectively be removed and accordingly, the planarizing is realized by removing much of the projected portions (refer to b'). However, at this occasion, it seems that the selective planarizing is not carried out with regard to microscopic, that is, short wavelength components, wave bottoms are removed along with wave tops and therefore, with regard to the short wavelength components the unevenness components remain substantially as they are (refer to a').

The invention has been carried out based on such knowledge and nanotopography is removed by adjusting the half value width d of the etching profile to be substantially equal to or smaller than the wavelength of the nanotopography (about a half).

As described above, the wavelength of the nanotopography falls in a range of 0.2 mm through 20 mm and accordingly, the half value width d of the etching profile is selected in a range of 0.1 mm through 20 mm according to the invention. By selecting the half value width d in such a range, projected portions of nanotopography can selectively be worked and nanotopography which has been regarded as impossible to be removed conventionally, can be removed.

The lower limit value 0.1 mm of the etching profile is prescribed since the shortest wavelength grasped as nanotopography is 0.2 mm and an etching profile smaller than the shortest wavelength cannot actually be produced. Further, upper limit value 20 mm is prescribed since the longest wavelength grasped as nanotopography is 20 mm.

In order to provide the half value width d of a predetermined etching profile, the nanotopography removing apparatus is previously attached with a discharge tube (for example, alumina discharge tube 2) having such a nozzle portion 20 and it is also possible to make the nozzle portion 20 separable from the alumina discharge tube 2 and interchangeable by itself or along with the duct 44.

Nanotopography differs by respective silicon wafer and nanotopography appears uniformly over an entire face thereof or appears segregatedly. Further, a density of the distribution varies. When nanotopography is distributed uniformly, the nozzle is scanned similar to the conventional planarizing apparatus and scanning speed is controlled in accordance with unevenness. In this case, the conventional planarizing can simultaneously be carried out.

Figure 4:
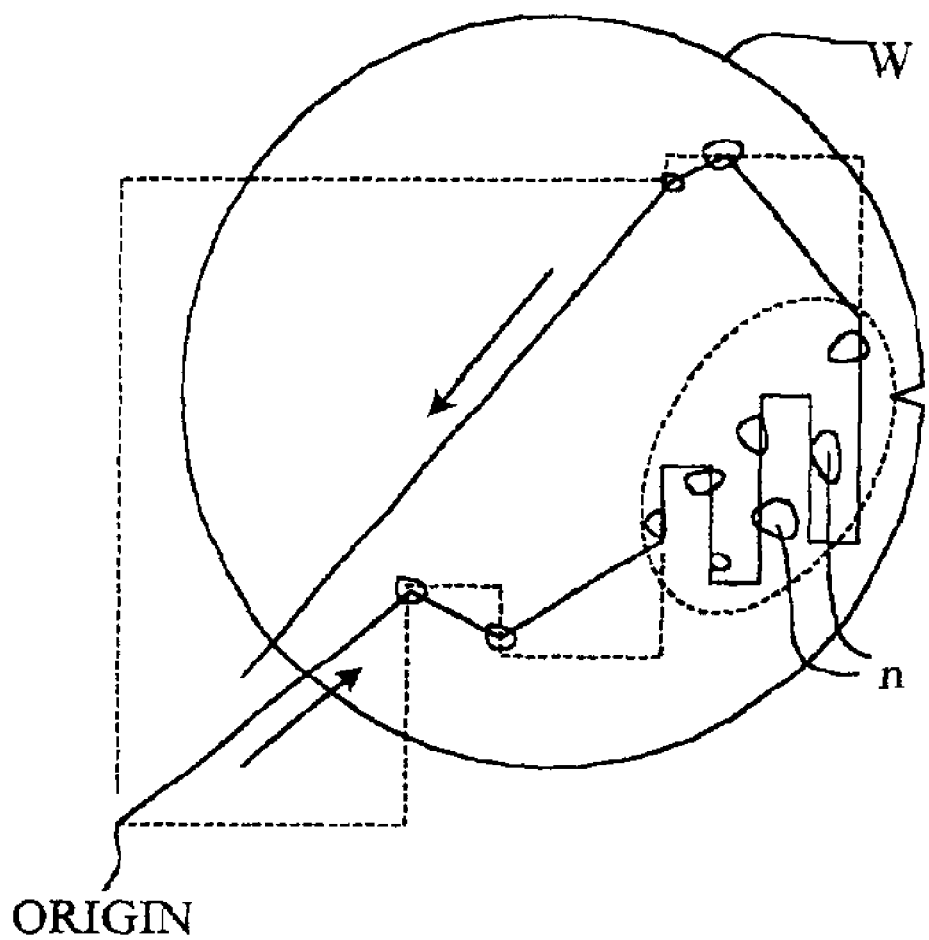
FIG. 4 is a view showing a resolution measure when a projected portion n of nanotopography is segregated and showing an example of a locus when a nozzle is moved.

Meanwhile, when nanotopography is segregated, when the nozzle is scanned over an entire face as in the conventional apparatus, the nozzle passes through even unnecessary locations and therefore, a working time period is unnecessarily prolonged. FIG. 4 shows a resolution measure when a projected portion n of such a nanotopography is segregated and is a view showing an example of a locus when the nozzle is moved. There are unevenness of nanotopography in which an aggregated number thereof are grouped and isolated. With regard to the isolated ones, the nozzle is moved at the fastest speed bypassing through a shortest path and the speed is reduced there and projected portions are worked.

Meanwhile, with regard to the grouped ones, as shown by a surrounding of dotted lines of FIG. 4, an area including the group is pertinently determined, the nozzle is moved at the fastest speed up to the area and at inside of the area, the nozzle is scanned by controlling the speed in accordance with degrees of unevenness. According to the example shown here, although there is needed a function of simultaneously driving the X drive motor 50 and the Y drive motor 51 of the X-Y drive mechanism 5 in order to pass a shortest path in a skewed direction, when there is not such a function, as shown by loci of dotted lines of FIG. 4, the X drive motor 50 and the Y drive motor 51 can also be driven by themselves respectively. In either of the cases, a distance and a time period of moving the nozzle can be made shorter than those in scanning the entire face of the wafer.

Amounts (heights or wave heights), locations and distributions of unevenness of nanotopography have previously been measured by a measuring instrument (not illustrated) for respective semiconductor wafers and measurement data outputted from the measuring instrument is analyzed by the control computer 49. By the analysis, there are calculated necessary speed or scanning speed (amount removed by etching), loci of the nozzle, nanotopography to be grouped and its area and the like.

As has been described above, according to the method and the apparatus of the invention, there is achieved an effect of capable of removing nanotopography which has already been produced on a surface of a semiconductor wafer which has been regarded as impossible to remove. Further, by constituting the half value width of etching profile of the activated species gas to be equal to or smaller than a wavelength of nanotopography and in a range equal to or larger than a half thereof, there is achieved an effect of capable of selectively removing projected portions of nanotopography.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A nanotopography removing method for removing nanotopography on a surface of a semiconductor wafer by providing a flow of an activated species gas to a surface of the semiconductor wafer, comprising:

measuring the nanotopography on the surface of the semiconductor wafer; and controlling a speed of moving the flow relative to and parallel to the surface of the semiconductor wafer and a locus of the flow along the surface of the semiconductor wafer based on the measured nanotopography.

2. A nanotopography removing method according to claim 1, wherein a half value width of an etching profile of said activated species gas is smaller than or equal to a wavelength of the measured nanotopography and larger than or equal to a half of the wavelength.

3. A nanotopography removing method according to claim 1, wherein said activated species gas comprises a plasma including sulfur hexafluoride gas.

4. A nanotopography removing method according to claim 2, wherein said activated species gas comprises a plasma including sulfur hexafluoride gas.

* * * * *